(12) United States Patent
Ihn et al.

(10) Patent No.: US 8,981,214 B2
(45) Date of Patent: Mar. 17, 2015

(54) ORGANIC SOLAR CELL AND METHOD OF MAKING THE SAME

(75) Inventors: Soo-Ghang Ihn, Hwaseong-si (KR); Bulliard Xavier, Suwon-si (KR); Sung-Young Yun, Suwon-si (KR); Woong Choi, Seongnam-si (KR); Tae-Sang Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 730 days.

(21) Appl. No.: 12/913,349

(22) Filed: Oct. 27, 2010

(65) Prior Publication Data

US 2011/0272029 A1    Nov. 10, 2011

(30) Foreign Application Priority Data

May 4, 2010    (KR) .......................... 10-2010-0041887

(51) Int. Cl.
| | |
|---|---|
| *H01L 31/00* | (2006.01) |
| *H01L 51/42* | (2006.01) |
| *H01L 51/44* | (2006.01) |
| *H01L 51/00* | (2006.01) |

(52) U.S. Cl.
CPC .......... *H01L 51/442* (2013.01); *H01L 51/4273* (2013.01); *H01L 51/0036* (2013.01); *H01L 51/4233* (2013.01); *Y02E 10/52* (2013.01); *Y02E 10/549* (2013.01)
USPC .......................................... 136/263; 136/256

(58) Field of Classification Search
CPC ............ H01L 31/1884; H01L 51/4253; H01L 51/424; H01L 51/022483
USPC ................................................ 136/243–265
See application file for complete search history.

(56) References Cited

U.S. PATENT DOCUMENTS

| | | | | |
|---|---|---|---|---|
| 5,279,678 | A  * | 1/1994 | Jordan et al. .................. | 136/244 |
| 2007/0193624 | A1* | 8/2007 | Krasnov ........................ | 136/258 |
| 2009/0229667 | A1* | 9/2009 | Shrotriya et al. ............. | 136/263 |
| 2009/0229670 | A1* | 9/2009 | Kitamura et al. ............. | 136/263 |

FOREIGN PATENT DOCUMENTS

| | | |
|---|---|---|
| JP | 11-233800 A | 8/1999 |
| JP | 2000-150934 A | 5/2000 |
| JP | 2002-217428 A | 8/2002 |
| JP | 2009-267222 A | 11/2009 |
| KR | 1020080019434 A | 8/1999 |

OTHER PUBLICATIONS

Owen, J. et al., Organic photovoltaic devices with Ga-doped ZnO electrode, Applied Physics Letters, vol. 90, No. 3; 2007, 033512-1-033512-3.

* cited by examiner

*Primary Examiner* — Jonathan Johnson
*Assistant Examiner* — Andrew Golden
(74) *Attorney, Agent, or Firm* — Cantor Colburn LLP

(57) ABSTRACT

An organic solar cell including a cathode and an anode, a photoactive layer disposed between the cathode and the anode, and a buffer layer between the photoactive layer and the cathode, wherein the cathode includes a compound represented by the following Chemical Formula 1

$$Zn_{(1-x)}M_xO_{(1-y)}W_y,\qquad\text{[Chemical Formula 1]}$$

and the buffer layer includes ZnO, and wherein in Chemical Formula 1, M is aluminum, gallium, indium, silicon, germanium, titanium, zirconium, hafnium, or a combination thereof, W is fluorine, bromine, or a combination thereof, and x and y are each independently greater than or equal to 0 and less than or equal to 0.1, provided that x and y are not simultaneously 0.

18 Claims, 5 Drawing Sheets

ORGANIC SOLAR CELL AND METHOD OF MAKING THE SAME

CROSS-REFERENCE TO RELATED APPLICATION

This application claims priority to Korean Patent Application No. 10-2010-0041887, filed on May 4, 2010, and all the benefits accruing therefrom under 35 U.S.C. §119, the content of which in its entirety is herein incorporated by reference.

BACKGROUND

1. Field

This disclosure relates to an organic solar cell and method of making the same.

2. Description of the Related Art

A solar cell is a photoelectric energy conversion device which converts solar energy into electrical energy. Solar cells have drawn attention as a pollution-free next-generation energy source.

The solar cell can be classified as an inorganic solar cell or as an organic solar cell, depending on the material of a thin film used in the cell. Because an organic solar cell uses various organic semiconductive materials in relatively small amounts, it may be manufactured with a lower cost relative to an inorganic solar cell. In addition, because the thin film of an organic solar cell is fabricated in a wet process, the organic solar cell can be more easily fabricated.

In general, an organic solar cell is classified as a bi-layer p-n junction type of organic solar cell or a bulk heterojunction ("BHJ") type organic solar cell, depending on the structure of a photoactive layer. The bi-layer p-n junction type of organic solar cell may include a photoactive layer that includes a p-type semiconductive thin film and an n-type semiconductive thin film, while the BHJ type organic solar cell may include a photoactive layer in which an n-type semiconductor and a p-type semiconductor are blended with each other.

The bi-layer p-n junction-type organic solar cell is shown in FIG. 1. Referring to FIG. 1, an organic solar cell 100 includes a substrate 101, an indium tin oxide ("ITO") anode 103, a photoactive layer 111, and a cathode 105. The photoactive layer 111 includes a p-type semiconductor thin film 107 and an n-type semiconductor thin film 109. The p-type semiconductor forms an exciton 117, which includes an electron 113 and a hole 115, when excited by light. The exciton is separated into an electron 113 and a hole 115 in a p-n junction region. The separated electron 113 and hole 115 respectively move toward the n-type semiconductive thin film 109 and the p-type semiconductive thin film 107 and are then collected in the cathode 105 and the anode 103, so that they can be used as electrical energy.

A solar cell desirably has high efficiency to produce as much electrical energy as possible from a given amount of solar energy. In order to increase the efficiency of a solar cell, it is important to generate numerous excitons inside a semiconductor and also to bring the produced charge to the outside without a loss.

However, while not wanting to be bound by theory, it is understood that charges may be mainly lost when the produced electrons and holes recombine. Accordingly, many methods of delivering the produced electrons and holes to an electrode without loss have been suggested. The suggested methods generally call for an additional process, and thus undesirably increase manufacturing cost. Thus, there remains a need for materials and methods that provide improved charge separation.

SUMMARY

Disclosed is an organic solar cell having improved stability by decreasing a resistance at the interface of a photoactive layer and a cathode therein. In particular, the organic solar cell may be manufactured with a very low cost using an inexpensive cathode material.

In an embodiment, provided is an organic solar cell including a cathode and an anode, a photoactive layer between the cathode and the anode, and a buffer layer between the photoactive layer and the cathode, wherein the cathode may include a compound represented by the following Chemical Formula 1

$$Zn_{(1-x)}M_xO_{(1-y)}W_y,\qquad\text{[Chemical Formula 1]}$$

and the buffer layer may include ZnO, wherein, in Chemical Formula 1, M is aluminum (Al), gallium (Ga), indium (In), silicon (Si), germanium (Ge), titanium (Ti), zirconium (Zr), hafnium (Hf), or a combination thereof, W is fluorine (F), bromine (Br), or a combination thereof, and x and y are each independently greater than or equal to 0 and less than or equal to 0.1, provided that x and y are not simultaneously 0.

In an embodiment, the buffer layer is directly on the cathode, the photoactive layer is directly on the buffer layer, and the anode is directly on the photoactive layer.

The cathode has a thickness from a first surface contacting the buffer layer to a second surface opposite the first surface, and the cathode comprises an M or W concentration gradient layer which has a thickness of about 1/10 to about 1/2 of the cathode thickness.

A concentration of M or W in the concentration gradient layer may decrease in a direction towards the buffer layer.

A concentration of M or W in the concentration gradient layer may increase in a direction away from the buffer layer.

An M or W doping ratio of a compound of the M or W concentration gradient layer may be according to the following Equation 1.

$$y = \frac{c}{d}x \qquad\text{[Equation 1]}$$

In Equation 1, y refers to the M or W doping ratio of the compound of the M or W concentration gradient layer, d refers to the total thickness of the M or W concentration gradient layer, c refers to an M or W doping ratio of a compound of a non-concentration gradient layer of the cathode, and x refers to a distance from the first surface of the cathode.

An M or W doping ratio of a compound of the concentration gradient layer may be according to the following Equation 2.

$$y = \frac{c}{\sqrt{d}}x \qquad\text{[Equation 2]}$$

In Equation 2, y refers to the M or W doping ratio of the compound in the M or W concentration gradient layer, d refers to a total thickness of the M or W concentration gradient layer, c refers to an M or W doping ratio of a compound of a non-concentration gradient layer of the cathode, and x refers to a distance from the first surface of the cathode.

An M or W doping ratio of a compound of the concentration gradient layer may be according to the following Equation 3.

$$y = \frac{c}{d^2} x \quad \text{[Equation 3]}$$

In Equation 3, y refers to the M or W doping ratio of the compound of the M or W concentration gradient layer, d refers to a total thickness of the M or W concentration gradient layer, c refers to an M or W doping ratio of a compound of a non-concentration gradient layer of the cathode, and x refers to a distance from the first surface of the cathode.

The M or W concentration gradient layer may include a plurality of layers each having a thickness of about 1 to about 50 nanometers in a direction from the first surface of the cathode, and wherein each layer of the plurality of layers has an M or W doping ratio of the compound of the M or W concentration gradient layer of about 0.02 to about 5 mole percent.

In an embodiment, x may be greater than or equal to about 0 and less than or equal to about 0.05, and y may be greater than or equal to about 0 and less than or equal to about 0.05, with the proviso that x and y are not simultaneously 0.

The cathode may have a thickness of about 100 to about 1000 nanometers.

The M or W concentration gradient layer may have a thickness of about 10 to about 500 nanometers.

The buffer layer may further include amorphous ZnO.

The buffer layer may further include amorphous ZnO and crystalline ZnO.

The buffer layer may have a hole-blocking characteristic.

The organic solar cell may further include a transparent substrate disposed on a second side of the cathode.

The transparent substrate may include glass, polycarbonate, polymethylmethacrylate, polyethylene terephthalate ("PET"), polyethylene naphthalate ("PEN"), polyimide, polyethersulfone ("PES"), or a combination thereof.

The anode may be selected from a metal, a metal alloy, a semi-metal, a light-transmissible transparent oxide, or a combination thereof.

The photoactive layer may include an electron provider and an electron receiver.

DETAILED DESCRIPTION

Figure 1:
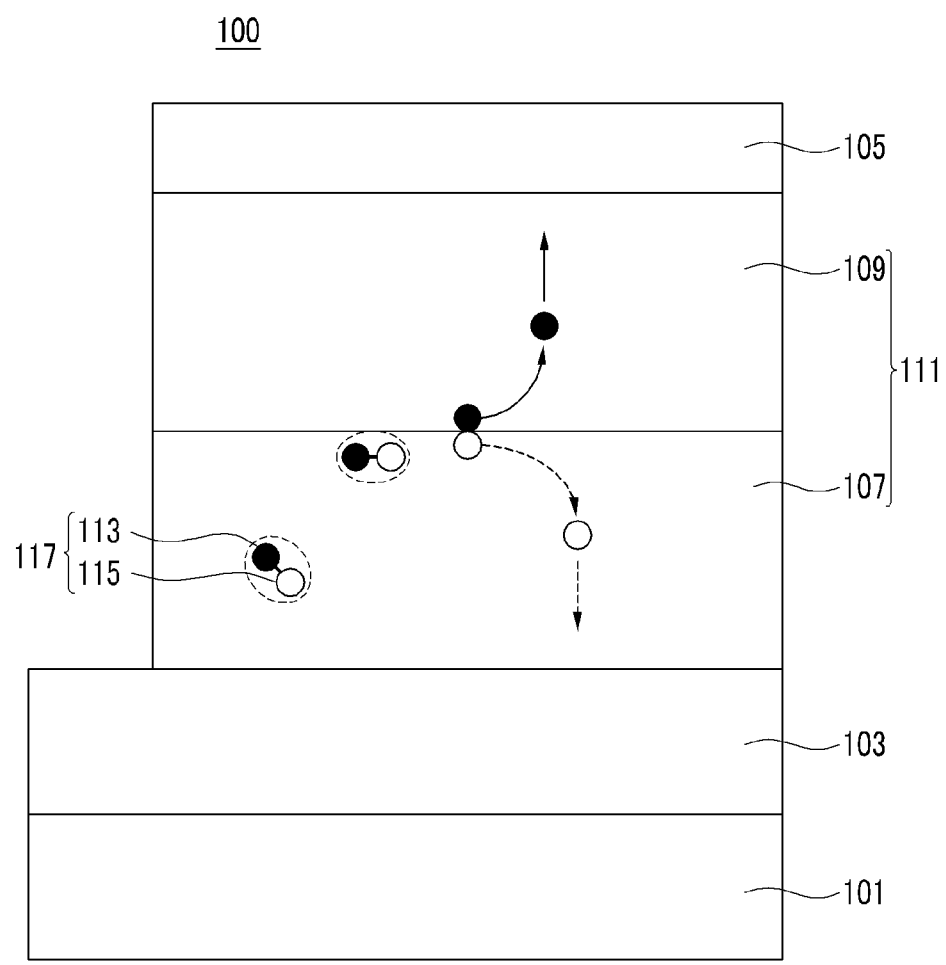
FIG. 1 is a schematic diagram showing an embodiment of the structure of a bi-layer p-n junction type of organic solar cell.

This disclosure will be described more fully hereinafter in the following detailed description of this disclosure, in which representative embodiments are disclosed. This disclosure may be embodied in many different forms and is not be construed as limited to the embodiments set forth herein; rather, these embodiments are provided so that this disclosure will satisfy applicable legal requirements.

In the drawings, the thickness of layers, films, panels, regions, etc., are exaggerated for clarity. The same reference numerals refer to similar parts through the specification.

It will be understood that when an element such as a layer, a film, a region, or a substrate is referred to as being "on" another element, it can be directly on the other element, i.e., in contact with at least a portion of the other element, or intervening elements may also be present. On the contrary, when an element is referred to as being "directly on" another element, there are no intervening elements present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer, or section from another element, component, region, layer or section. Thus, a first element, component, region, layer, or section discussed below could be termed a second element, component, region, layer, or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

According to an embodiment, provided is an organic solar cell including a cathode and an anode facing each other, a photoactive layer disposed between the cathode and the anode, and a buffer layer disposed between the photoactive layer and the cathode. The cathode includes a compound represented by the following Chemical Formula 1, and the buffer layer includes ZnO.

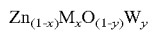  [Chemical Formula 1]

In Chemical Formula 1, M is aluminum (Al), gallium (Ga), indium (In), silicon (Si), germanium (Ge), titanium (Ti), zirconium (Zr), hafnium (Hf), or a combination thereof, W is fluorine (F), bromine (Br), or a combination thereof, and x and y are each independently greater than or equal to 0 and less than or equal to 0.1 (e.g., 0≤x≤0.1 and 0≤y≤0.1), provided that x and y are not simultaneously zero.

In an embodiment, the organic solar cell may be a normal cell or an inverted cell.

Hereinafter, referring to FIG. 2, a normal cell or an inverted cell according to an embodiment will be further disclosed, but is not limited to the illustration.

Figure 2:
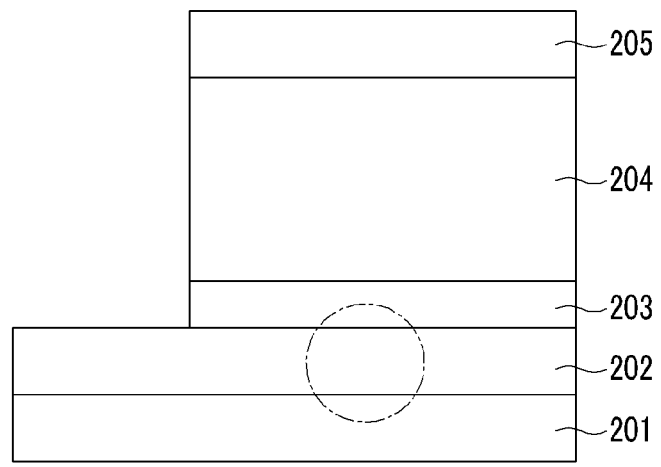
FIG. 2 is a schematic diagram showing an embodiment of the inverted stacking structure of an organic solar cell.

FIG. 2 is a cross-sectional view of an embodiment of an inverted cell. The inverted cell may include a cathode 202, a buffer layer 203 on the cathode 202, a photoactive layer 204 on the buffer layer, and an anode 205 on the photoactive layer 204.

The inverted organic solar cell may further include a transparent substrate 201 on a side of the cathode 202 which is opposite the buffer layer 203. Examples of the transparent substrate 201 may include glass, polycarbonate, polymethylmethacrylate, polyethylene terephthalate ("PET"), polyethylene naphthalate ("PEN"), polyimide, polyethersulfone ("PES"), or a combination thereof, but they are not limited thereto as long as they can be used for an organic solar cell.

In general, while a commercially available organic solar cell includes an anode disposed towards a transparent substrate which receives light, an inverted organic solar cell includes a cathode disposed towards a transparent substrate and an anode may comprise a material with a larger work function than the cathode.

The cathode 202 may include a compound represented by Chemical Formula 1. Specifically, in the above Chemical Formula 1, when M is gallium (Ga), the cathode may be gallium-doped ZnO ("GZO"). When M is aluminum (Al), the cathode may be aluminum-doped ZnO ("AZO"). When M is indium (In), the cathode may be indium-doped ZnO ("IZO").

The doping element and its doping ratio can be selected to control an electrical conductivity of the cathode 202. The doping ratio refers to the amount of M and W, which is determined by x and y in Chemical Formula 1. For example, when x and y are 0, the compound represented by the above Chemical Formula 1 is ZnO. When the x is 0.1 and y is 0, the compound represented by the above Chemical Formula 1 is $Zn_{0.9}M_{0.1}O$. Herein, the compound $Zn_{0.9}M_{0.1}O$ refers to a compound which is doped with M in an amount of 0.1 parts when the entire amount of Zn is 1 part. In other words, M is doped in an amount of 10 mole percent ("mol %"). Accordingly, the compound may be referred to as having a doping ratio of 10 mol %.

The cathode 202 includes a buffer layer 203 thereon. While not wanting to be bound by theory, the buffer layer 203 may block holes when holes and electrons are generated in the photoactive layer 204 and transport to the cathode 202. The buffer layer 203 may include ZnO. Because the buffer layer 203 and the cathode 202 are comprise a compound including similar elements, they may have remarkably decreased resistance on an interface between the buffer layer 203 and the cathode 202, and may improve a stability of an organic solar cell.

The buffer layer 203 may include amorphous ZnO or both amorphous ZnO and crystalline ZnO. The content of crystalline ZnO can be selected to control hole-blocking and electron-delivering characteristics.

According to an embodiment, the buffer layer 203 and the cathode 202 can be combined to problems associated with use of indium tin oxide ("ITO"). A commercially available organic solar cell including an ITO electrode has environmental and cost problems due to the toxic properties of In. In addition, the combination of the buffer layer 203 and the cathode 202 can be particularly applied to a flexible organic solar cell module.

Figure 3:
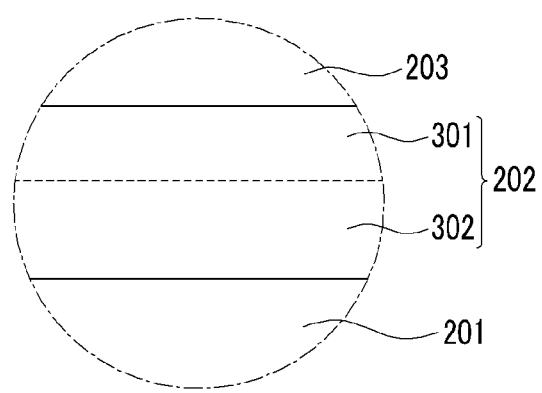
FIG. 3 is an enlarged view of an embodiment of a cathode.

FIG. 3 provides an enlarged view of a schematic diagram of an embodiment including the cathode 202.

As shown in FIG. 3, the cathode 202 may further include a concentration gradient layer 301 and a non-concentration gradient layer 302. In an embodiment, the cathode 202 is composed of a concentration gradient layer 301 and a non-concentration gradient layer 302.

The cathode 202 has a first surface and an opposite second surface. The concentration gradient layer 301 contacts the buffer layer 203 at the first surface of the cathode 202. In an embodiment, the first surface of the cathode 202 may be referred to as a top surface, and the second surface of the cathode 202 may be referred to as a bottom surface thereof. A distance from the first surface of the cathode 202 to the second surface thereof is a thickness of the cathode 202. A thickness of a concentration gradient layer may be about 1/10 to about 1/2 of the thickness of the cathode 202, specifically 0.2 to about 0.4 of the thickness of the cathode 202, more specifically about 0.3 of the thickness of the cathode 202, and the cathode 202 comprises the M or W concentration gradient.

When the concentration gradient layer 301 has a thickness within the foregoing range, it can effectively decrease a resistance of an interface between the buffer layer 203 and the cathode 202.

A concentration of M or W in the concentration gradient layer 301 decreases according to a distance towards (e.g. closer to) the buffer layer 203. Thus the concentration of M or W in the concentration gradient layer 301 increases at locations farther away from the buffer layer 203, wherein M or W are according to Chemical Formula 1.

Thus an M or W doping ratio in the above Chemical Formula 1 can change gradually, to select a resistance at the interface of the buffer layer 203 and the cathode 202.

The concentration gradient layer 301 may be based on the following Equation 1.

$$y = \frac{c}{d}x \qquad \text{[Equation 1]}$$

In Equation 1, y refers to an M or W doping ratio of a compound in the concentration gradient layer, d refers to the total thickness of the concentration gradient layer, c refers to an M or W doping ratio of a compound in a non-concentration gradient layer of the cathode, and x refers to a distance (e.g. a vertical distance) from the first (e.g., top) surface of the cathode.

Figure 4A:
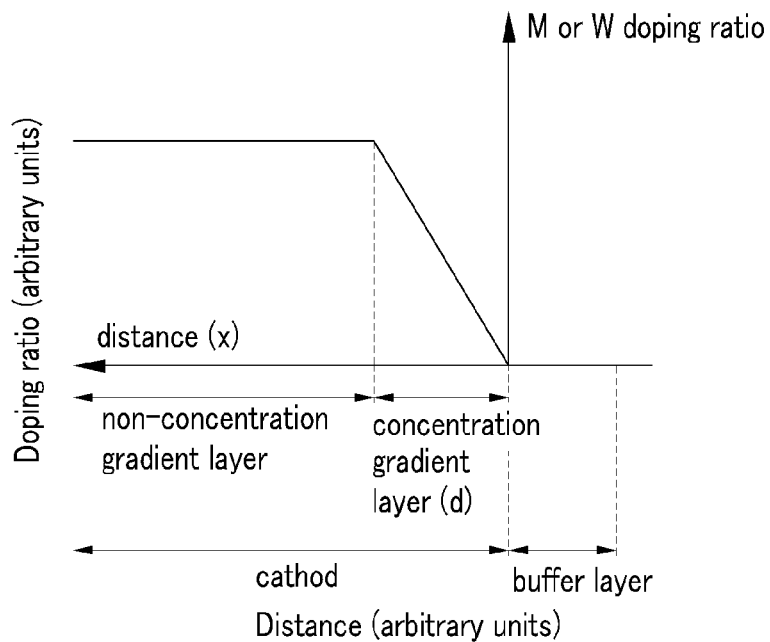
FIGS. 4A to 4D are graphs of doping ratio versus distance (arbitrary units) showing the doping ratio change of a concentration gradient layer inside a cathode.

The doping ratio of Equation 1 is further illustrated in FIG. 4A. As shown in FIG. 4A, the concentration gradient layer 301 may have a doping ratio that changes linearly from the buffer layer 203 to the non-concentration gradient layer 302.

The concentration gradient layer 301 may be based on the following Equations 2 or 3.

$$y = \frac{c}{\sqrt{d}} x \qquad [\text{Equation 2}]$$

$$y = \frac{c}{d^2} x \qquad [\text{Equation 3}]$$

In Equation 2 or 3, y refers to an M or W doping ratio of a compound of the concentration gradient layer, d refers to the total thickness of the concentration gradient layer, c refers to an M or W doping ratio of a compound in a non-concentration gradient layer of the cathode, and x refers to a vertical distance from the first (e.g., top) surface of the cathode.

Figure 4B:
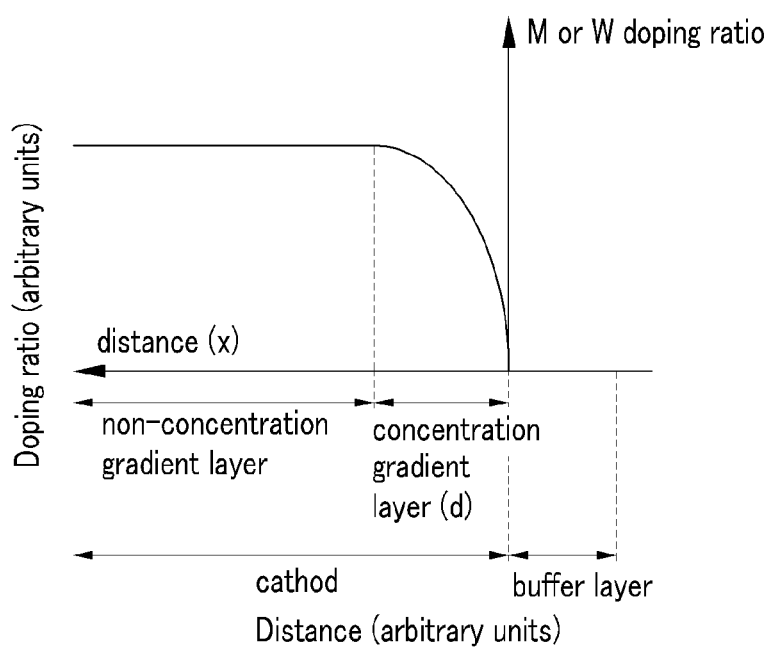
Figure 4C:
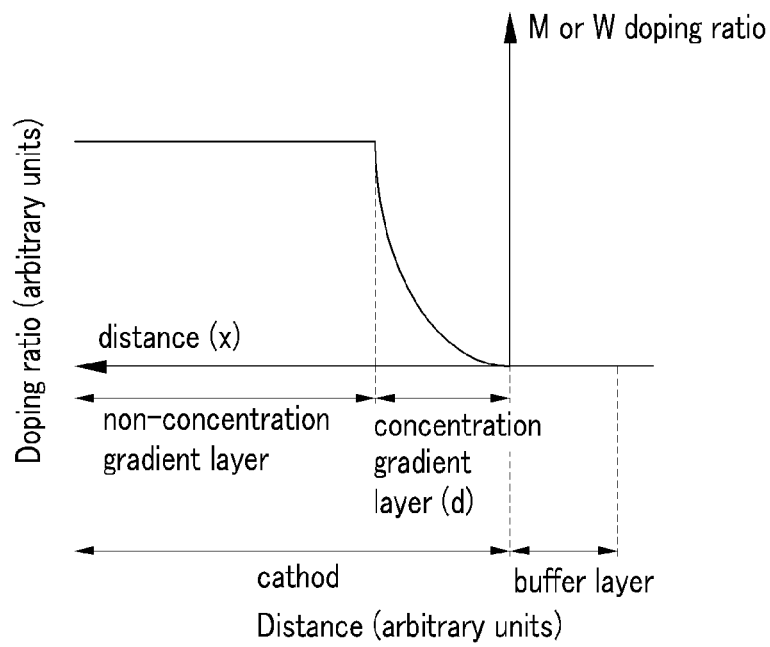

The doping ratio based on Equations 2 or 3 is further illustrated in FIGS. 4B and 4C. As shown in FIGS. 4B and 4C, the concentration gradient layer 301 may have a doping ratio which changes in a parabolic fashion from the buffer layer 203 to the non-concentration gradient layer 302.

Figure 4D:
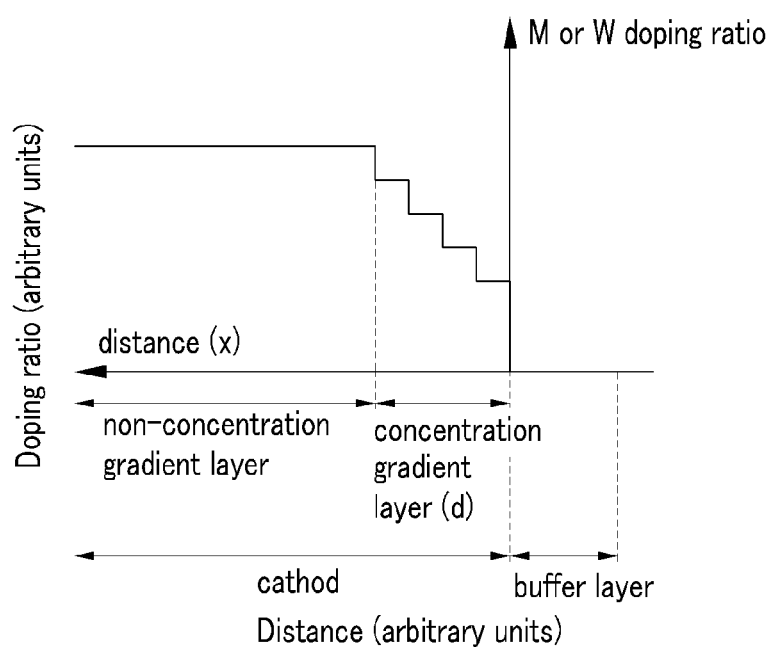

In addition, the concentration gradient layer 301 may include a plurality of layers each having a thickness of about 1 to about 50 nm from the first (e.g., top) surface of the cathode 202. Each neighboring layer may have a different M or W doping ratio, which may be about 0.02 to about 5 mol % in a compound. Thus, in an embodiment, the doping ratio may vary in a stair-step (e.g. stepped) shape. The stepped change is further illustrated in FIG. 4D.

Hereinafter, a chemical vapor deposition ("CVD") method of forming a concentration gradient layer 301 will be further illustrated.

When a concentration gradient layer 301 is disposed (e.g., formed) by providing a dopant gas on the first surface of the cathode 202, content of the dopant gas may be gradually reduced and finally stopped. Herein, when the dopant gas is linearly decreased, the doping ratio can be variously changed depending on the relationship between the dopant gas and doping concentration.

Alternatively, a molecular beam epitaxy ("MBE") method similar to the aforementioned method suggests that the doping ratio should be changed while gradually lowering the temperature of a dopant to decrease the amount of gasified dopant.

The concentration gradient layer 301 may have various doping ratios depending on the doping ratio of the above Chemical Formula 1.

In particular, in the above Chemical Formula 1, x is greater than or equal to 0 and less than or equal to about 0.05 (e.g., $0 \leq x \leq 0.05$) and y is greater than or equal to 0 and less than or equal to about 0.05 (e.g., $0 \leq y \leq 0.05$), specifically x is greater than or equal to 0.01 and less than or equal to about 0.04 and y is greater than or equal to 0.01 and less than or equal to about 0.04, more specifically x is about 0.03 and y is about 0.03, with the proviso that the x and y are not simultaneously 0 in any doping ratio.

In particular, Chemical Formula 1 may have the following doping ratios.

For example, when M is Ga in gallium doped zinc oxide ("GZO"), x is about 0.005 to about 0.1, y may be 0. In addition, when x is about 0.03 to about 0.05, y may be 0.

In addition, when M is Al in aluminum doped zinc oxide ("AZO"), x is about 0.005 to about 0.1, y can be 0. Furthermore, when x is about 0.02 to about 0.04, y may be 0.

Further, when M is indium doped zinc oxide ("IZO"), x is about 0.01 to about 0.1, y may be 0. In addition, when x is about 0.05 to about 0.03, y may be 0.

The cathode 202 may have a thickness of about 100 nm to about 1000 nm, specifically about 200 nm to about 900 nm, more specifically about 300 nm to about 800 nm. When the cathode 202 has a thickness within the range, it can be included to fabricate an organic solar cell having effective light transmission and electrical conductivity.

When the cathode 202 has the above thickness, the concentration gradient layer 301 may have a thickness of about 10 nm to about 500 nm, specifically about 20 nm to about 450 nm, more specifically about 40 nm to about 400 nm. The cathode 202 having a thickness within the foregoing range can have minimum resistance on the interface with the buffer layer 203.

The anode 205 may be a metal, a metal alloy, a semi-metal, a light transmissible transparent oxide, or a combination thereof. When an organic solar cell according to an embodiment has an inverted stacking structure, the anode may have a larger work function than the cathode.

Examples of the metal may include an alkali metal such as Li, Na, or the like; an alkaline-earth metal such as Be, Mg, or the like; Al; a transition elements such as Ag, Au, Co, Ir, Ni, Os, Pd, Pt, or the like; a rare earth element; or a semi-metal such as Se, or the like; or a combination comprising at least one of the foregoing. Examples of the metal alloy may include a Na—K alloy, an Mg—In alloy, an Al—Li alloy, or the like, or a combination comprising at least one of the foregoing. In addition, a first layer including the metal or metal alloy and a second layer including the metal oxide or halide may be stacked to fabricate the anode 205. For example, the electrode may be made of $MoO_3/Ag$, $Al_2O_3/Al$, and the like. The light-transmissible (e.g., transparent or translucent) transparent oxide of the anode 205 may include ITO, $SnO_2$, IZO, AZO, GZO, or the like, or a combination comprising at least one of the foregoing, and may include a light-transmissible oxide having a larger work function than the anode 205.

Although not shown in the drawing, the anode 205 and the photoactive layer 204 may further include a layer having electron-blocking and hole-delivering characteristics. The layer having electron-blocking and hole-delivering characteristics may comprise a transition metal oxide, such as $MoO_3$, $V_2O_5$, $WO_3$, or the like, or a combination comprising at least one of the foregoing. In addition, examples of a conductive polymer include poly(3,4-ethylenedioxythiophene) poly(styrenesulfonate) ("PEDOT:PSS"), polyaniline, polypyrrole, poly(p-phenylene vinylene), (poly[2-methoxy-5-(2'-ethylhexyloxy)-1,4-phenylene vinylene) ("MEH-PPV"), MDMO-PPV (poly(2-methoxy-5-(3,7-dimethyloctyloxy)-1,4-phenylene-vinylene), poly(3-alkylthiophene), polythiophene, or the like; pentacene; phthalocyanine Blue BN (e.g., CuPc); a low molecular organic material such as a triphenyldiamine derivative ("TPD"); or the like; or a combination comprising at least one of the foregoing.

The selected electrode and its interface layer may determine a polarity of an organic solar cell. Accordingly, each material is desirably selected with regard to work function and band structure to overcome any unsymmetrical conductivity of electrons and -holes that may be present.

The photoactive layer 204 may include an electron provider and an electron receiver blended with each other therein.

The electron-provider may be a p-type semiconductor, and may include a conductive polymer, a low molecular semiconductor, or the like. It may, for example, include polyaniline, polypyrrole, polythiophene, poly(p-phenylene vinylene), poly[2-methoxy-5-(2'-ethyl-hexyloxy)-1,4-phenylene vinylene ("MEH-PPV"), poly(2-methoxy-5-(3,7-dimethyloctyloxy)-1,4-phenylene-vinylene ("MDMO-PPV"), pentacene, poly(3,4-ethylenedioxythiophene) ("PEDOT"), or poly (3-alkylthiophene), or in particular, poly (3-hexylthiophene) ("P3HT') or the like; or a combination comprising at least one of the foregoing.

The electron-receiver may include fullerene having large affinity such as C60, C70, C74, C76, C78, C82, C84, C720, C860, or the like; a fullerene derivative such as 1-(3-methoxycarbonybropyl-1-phenyl(6,6)C61 ("PCBM-C61"), 1-(3-methoxycarbonybropyl-1-phenyl(6,6)C71 ("PCBM-C71"), 1-3-methoxycarbonyl)propyl-1-phenyl(6,6)C84 ("PCBM-084"), bis-1-(3-methoxycarbonyl)propyl-1-phenyl(6,6)C61 ("bis-PCBM"), or the like; perylene; an inorganic semiconductor such as CdS, CdTe, CdSe, ZnO, or the like; or a combination thereof. PCBM may also be referred to as [6,6]-phenyl-C61-butyric acid methyl ester.

The electron-provider and the electron-receiver may be used in a weight ratio of about 1:9 to about 9:1, specifically about 1:8 to about 8:1, more specifically about 1:7 to about 7:1. When they are used within the range, the photoactive layer 204 may be easily disposed to improve photocurrent efficiency.

When excited by light, the electron-provider produces excitons, each exciton comprising an electron and hole pair. The exciton is separated into an electron and a hole at the interface of the electron-provider and the electron-receiver due to an electron affinity difference of the two materials. The separated electrons move toward a cathode through the electron provider by an intrinsic electric field, while the holes move toward an anode through the electron provider.

In addition, the photoactive layer 204 may further include a nanostructure (not shown) that receives electrons. The nanostructure may be electrically connected to the cathode 202 and can help electron delivery. Examples of the nanostructure may include a semiconductive element, a semiconductive compound, a semiconductive carbon material, a metallic carbon material surface-treated with a hole-blocking material, a metal surface-treated with a hole-blocking material, or the like, or a combination comprising at least one of the foregoing.

The nanostructure may have one-dimensional linear structure, a two-dimensional flat structure, or a three dimensional cubic structure.

The one dimensional linear structure refers to a structure having negligible thickness compared with its length. The two dimensional flat structure refers to a structure having negligible thickness compared with its area. The nanostructure may have various shapes, and may be a nanotube, nanorod, nanowire, nanotree, nanotetrapod, nanodisk, nanoplate, nanoribbon, or the like, or a combination thereof.

Hereinafter, representative embodiments are illustrated in further detail with reference to examples. However, the following are representative and shall not be limiting.

EXAMPLE

Example 1

Fabrication of an Organic Solar Cell

A bulk heterojunction ("BHJ") type of organic solar cell is fabricated by using 100 nm of Au as an anode, 3 nm of $MoO_3$ as an electronic blocking layer, a mixture of 200 nm poly-3 (hexylthiophene) ("P3HT") and [6,6]-phenyl-C61-butyric acid methyl ester ("PCBM") in a ratio of 1:1 as a photoactive layer, 50 nm of ZnO as a buffer layer, and 512 nm of $Ga_{0.03}Zr_{0.97}O$ as a cathode.

Comparative Example 1

Fabrication of an Organic Solar Cell

An organic solar cell is fabricated according to the same method as Example 1, except the buffer layer is omitted and indium tin oxide ('ITO') is used as a cathode.

Comparative Example 2

Fabrication of an Organic Solar Cell

An organic solar cell is fabricated according to the same method as Example 1, except ITO is used as a cathode.

Comparative Example 3

Fabrication of an Organic Solar Cell

An organic solar cell is fabricated according to the same method as Example 1, except the buffer layer is omitted.

Experimental Example

Experiment Method

The organic solar cells according to Example 1 and Comparative Examples 1 to 3 are measured regarding photocurrent-voltage, and then short circuit current ("Jsc"), open circuit voltage ("Voc"), fill factor coefficient ("FF"), and efficiency are calculated based on the photocurrent curved line. The results are provided in the following Table 1.

Herein, a xenon lamp (Oriel, 01193) is used as a light source. The xenon lamp is controlled to have a sun condition (AM 1.5) using a standard solar cell (calibrated by National Renewable Energy Laboratory, Trace No. FEQ061214-151341, Type of material: Mono-Si+KG-5 filter).

The fill factor coefficient is calculated by dividing a product of current density and voltage (Vmp×Jmp) at the maximum electric power point by a product of Voc and Jsc. The photoelectric conversion efficiency (η) of an organic solar cell refers to efficiency in converting solar energy into electrical energy, and is calculated as a ratio of electrical energy (current×voltage×fill factor coefficient) vs. energy received per unit area ("Pinc") as shown in the following Equation 4.

$$\eta = (Voc \cdot Jsc \cdot FF)/(Pinc) \qquad \text{[Equation 4]}$$

The Pinc refers to 100 milliwatts per square centimeter ($mW/cm^2$, e.g., 1 sun).

Experiment Results

Figure 5:
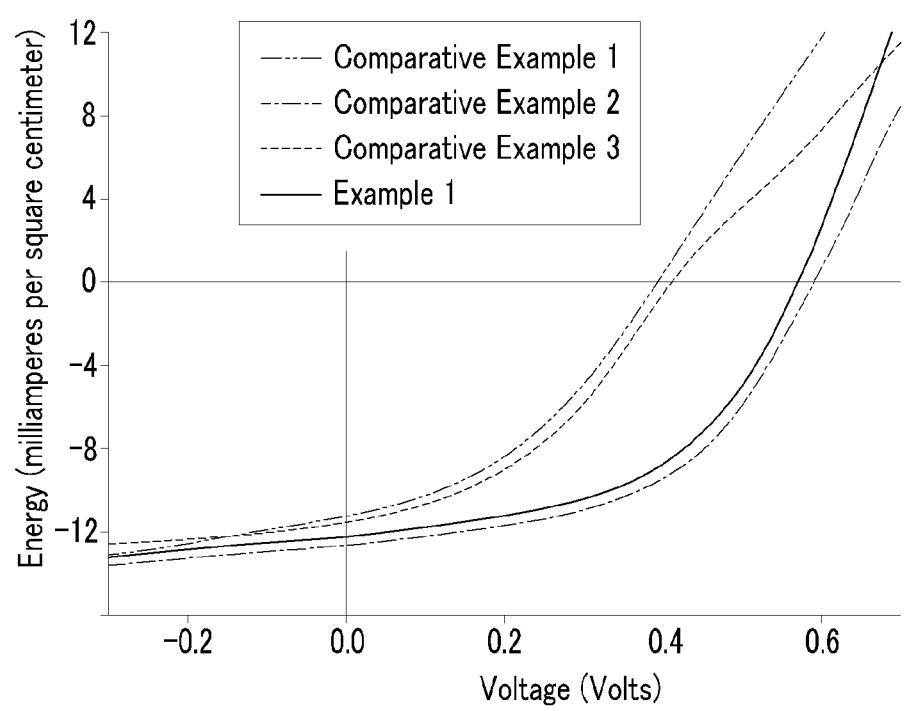
FIG. 5 is a graph of energy (milliamperes per square centimeter, $mA/cm^2$) versus voltage (volts, V) of organic solar cells according to Example 1 and Comparative Examples 1 to 3.

The experiment results are provided in the following Table 1 and in FIG. 5.

TABLE 1

| | Efficiency (%) | Jsc (mA/cm$^2$) | Voc (V) | FF | Rsh (at V = 0) (ohm · cm$^2$) | Rs (at V = Voc) (ohm · cm$^2$) |
|---|---|---|---|---|---|---|
| Comparative Example 1 | 1.81 | 11.38 | 0.40 | 0.398 | 132 | 18 |
| Comparative Example 2 | 3.69 | 12.57 | 0.59 | 0.498 | 179 | 15 |
| Comparative Example 3 | 1.93 | 11.37 | 0.41 | 0.414 | 185 | 23 |
| Example 1 | 3.49 | 12.14 | 0.57 | 0.504 | 199 | 9 |

In Table 1, Rsh refers to shunt resistance, Rs refers to series resistance.

As shown in Table 1, the organic solar cell including a ZnO buffer layer and a GZO cathode according to Example 1 has excellent efficiency compared the according to Comparative Examples 1 and 3, which did not include a buffer layer.

In addition, the organic solar cell according to Example 1 has equivalent performance to Comparative Example 2, which used ITO, an undesirably expensive material. Accordingly, disclosed is an organic solar cell with a cathode that is a practical alternative to ITO, which is expensive.

The Rsh refers to a shunt resistances of a device. In general, as the Rsh is larger, a device has a smaller leakage current in a reverse direction, which can result in more desirable device characteristics. Also, Rs refers to series resistance of a device. As the Rs becomes smaller, a device has a larger forward direction diode current, which may impede desirable device characteristics. An organic solar cell with the disclosed device structure has both a larger Rsh and a smaller Rs, thus it may have an improved fill factor coefficient, resulting in improved efficiency.

The organic solar cell of Example 1 had the largest Rsh but the smallest Rs, when compared with the Comparative Examples.

In particular, the organic solar cell of Example 1 has a very small Rs. While not wanting to be bound by theory, it is believed that the small Rs is due to a very small GZO/ZnO interface resistance, which is due to a similarity of the materials.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments are exemplary in every way and the claimed invention shall not be limited thereto.

What is claimed is:

1. An organic solar cell comprising:
a transparent substrate;
a non-concentration gradient layer of a cathode disposed on the transparent substrate;
a concentration gradient layer of the cathode disposed on the non-concentration gradient layer of the cathode;
a buffer layer comprising ZnO and disposed on the concentration gradient layer of the cathode;
a photoactive layer disposed on the buffer layer; and
an anode disposed on the photoactive layer,
wherein the non-concentration gradient layer and the concentration gradient layer of the cathode each independently comprise a compound represented by the following Chemical Formula 1, $$Zn_{(1-x)}M_xO_{(1-y)}W_y,  \quad \text{[Chemical Formula 1]}$$

wherein, in Chemical Formula 1,
M is aluminum, gallium, indium, silicon, germanium, titanium, zirconium, hafnium, or a combination thereof,
W is fluorine, bromine, or a combination thereof, and
x and y are each independently greater than or equal to 0 and less than or equal to 0.1, provided that x and y are not simultaneously 0, and
wherein a concentration of M or W in the concentration gradient layer of the cathode decreases in a direction towards the buffer layer.

2. The organic solar cell of claim 1, wherein the buffer layer is directly on the cathode, the photoactive layer is directly on the buffer layer, and the anode is directly on the photoactive layer.

3. The organic solar cell of claim 1, wherein the cathode has a thickness from a first surface contacting the buffer layer to a second surface opposite the first surface, and wherein the concentration gradient layer has a thickness of about 1/10 to about 1/2 of the thickness of the cathode.

4. The organic solar cell of claim 3, wherein a M or W doping ratio of the compound of Chemical Formula 1 of the concentration gradient layer of the cathode is according to Equation 1:

$$y = \frac{c}{d}x \quad \text{[Equation 1]}$$

wherein, in Equation 1, y refers to the M or W doping ratio of the compound of Chemical Formula 1 of the concentration gradient layer, d refers to a total thickness of the concentration gradient layer, c refers to an M or W doping ratio of the compound of Chemical Formula 1 of the non-concentration gradient layer of the cathode, and x refers to a distance from the first surface of the cathode.

5. The organic solar cell of claim 3, wherein a M or W doping ratio of the compound of Chemical Formula 1 of the concentration gradient layer of the cathode is according to Equation 2:

$$y = \frac{c}{\sqrt{d}}x \quad \text{[Equation 2]}$$

wherein, in Equation 2, y refers to the M or W doping ratio of the compound of Chemical Formula 1 in the concentration gradient layer, d refers to a total thickness of the concentration gradient layer, c refers to an M or W doping ratio of a compound of the compound of Chemical Formula 1 of the non-concentration gradient layer of the cathode, and x refers to a distance from the first surface of the cathode.

6. The organic solar cell of claim 3, wherein a M or W doping ratio of a compound of Chemical Formula 1 of the concentration gradient layer is according to Equation 3:

$$y = \frac{c}{d^2}x \quad \text{[Equation 3]}$$

wherein, in Equation 3, y refers to the M or W doping ratio of the compound of Chemical Formula 1 of the concentration gradient layer, d refers to a total thickness of the concentration gradient layer, c refers to an M or W doping ratio of the compound of Chemical Formula 1 of the non-concentration gradient layer of the cathode, and x refers to a distance from the first surface of the cathode.

7. The organic solar cell of claim 3, wherein the M or W concentration gradient layer comprises a plurality of layers each having a thickness of about 1 to about 50 nanometers in a direction from the first surface of the cathode, and wherein each layer of the plurality of layers has an M or W doping ratio of the compound of the M or W concentration gradient layer of about 0.02 to about 5 mole percent.

8. The organic solar cell of claim 1, wherein x is greater than or equal to about 0 and less than or equal to about 0.05, and y is greater than or equal to about 0 and less than or equal to about 0.05, with the proviso that x and y are not simultaneously 0.

9. The organic solar cell of claim 1, wherein the cathode has a thickness of about 100 to about 1000 nanometers.

10. The organic solar cell of claim 3, wherein the M or W concentration gradient layer has a thickness of about 10 to about 500 nanometers.

11. The organic solar cell of claim 1, wherein the buffer layer further comprises amorphous ZnO.

12. The organic solar cell of claim 1, wherein the buffer layer further comprises both amorphous ZnO and crystalline ZnO.

13. The organic solar cell of claim 1, wherein the buffer layer has a hole-blocking characteristic.

14. The organic solar cell of claim 1, wherein the transparent substrate is glass, polycarbonate, polymethylmethacrylate, polyethylene terephthalate, polyethylene naphthalate, polyimide, polyethersulfone, or a combination thereof.

15. The organic solar cell of claim 1, wherein the anode is a metal, a metal alloy, a semi-metal, a light-transmissible transparent oxide, or a combination thereof.

16. The organic solar cell of claim 1, wherein the photoactive layer comprises an electron provider and an electron acceptor.

17. The organic solar cell of claim 1, further comprising:
a transition metal oxide layer between the anode and the photoactive layer.

18. The organic solar cell of claim 17, wherein the transition metal oxide layer comprises $MoO_3$, $V_2O_5$, $WO_3$, or a combination thereof.

* * * * *